United States Patent [19]
Itoh

[11] Patent Number: 5,820,947
[45] Date of Patent: *Oct. 13, 1998

[54] PLASMA PROCESSING METHOD AND APPARATUS

[75] Inventor: Kenji Itoh, Kanagawa, Japan

[73] Assignee: Semicondutor Energy Laboratory Co., Ltd., Kanagawa-ken, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 820,985

[22] Filed: Mar. 19, 1997

Related U.S. Application Data

[63] Continuation of Ser. No. 441,704, May 15, 1995, abandoned.

[30] Foreign Application Priority Data

May 17, 1994 [JP] Japan ................................ 6-126829

[51] Int. Cl.⁶ ......................................................... H05H 1/24
[52] U.S. Cl. .......................... 427/577; 118/50; 118/723 I; 118/723 E; 118/723 MW; 427/131; 427/249; 427/294; 427/488; 427/535; 427/569; 427/575

[58] Field of Search ...................................... 427/488, 535, 427/569, 575, 577, 294, 131, 249; 118/723 MW, 723 E, 723 I, 50

[56] References Cited

U.S. PATENT DOCUMENTS

4,524,089  6/1985  Haque et al. ........................ 427/575 X

*Primary Examiner*—Bernard Pianalto
*Attorney, Agent, or Firm*—Sixbey, Friedman, Leedom, & Ferguson; Gerald J. Ferguson, Jr.; Eric J. Robinson

[57] ABSTRACT

In a vapor phase apparatus such as a plasma chemical vapor deposition (CVD) having a pair of electrodes, a surface of one of the electrodes has an uneven shape (concave portion and convex portion). An interval between the electrodes is 10 mm or less. A density of a convex portion is increased in a center portion of the electrode. An aspect ratio of the uneven shape is increased from a peripheral portion of the electrode to a center portion of the electrode. The aspect ratio represents a ratio (b/a) of a pitch (a) and a height (b) of the convex portion.

32 Claims, 7 Drawing Sheets

FIG. 8B

PLASMA PROCESSING METHOD AND APPARATUS

This application is a continuation of Ser. No. 08/441,704, filed May 15, 1995, now abandoned.

BACKGROUND OF THE INVENTION

The present invention relates to a plasma processing apparatus such as a plasma chemical vapor deposition (CVD) and an etching apparatus and a plasma processing method.

A plasma processing apparatus (parallel plate type) such as plasma CVD apparatus is well known. In such parallel plate type plasma processing apparatus (including a film forming apparatus and an etching apparatus), it is necessary to perform uniform processing and increase a processing speed.

Figure 2:
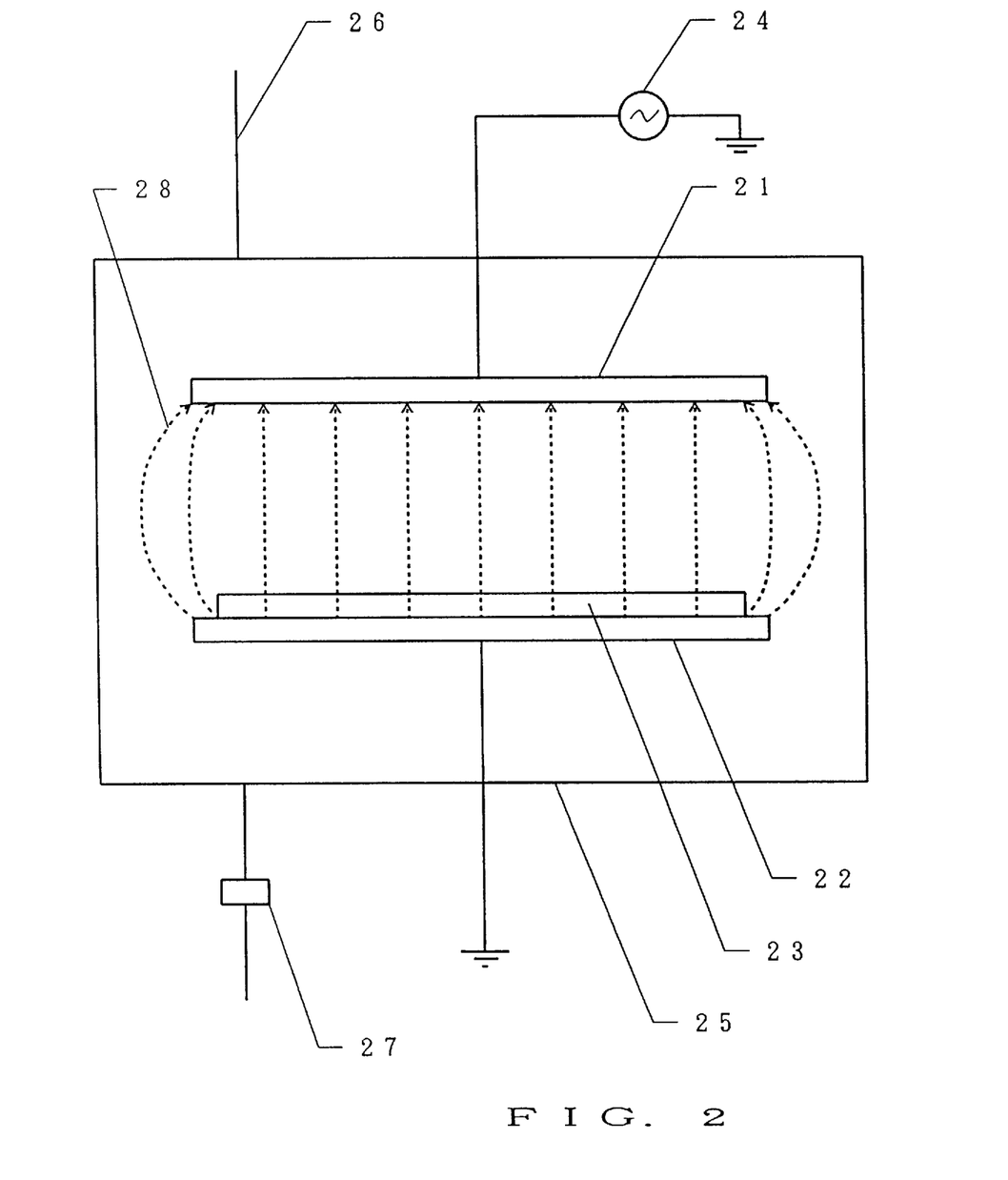
FIG. 2 shows a schematic view of a conventional plasma CVD apparatus.

FIG. 2 shows a parallel plate type plasma processing apparatus constructed by a pair of plate electrodes to be arranged in parallel. This apparatus includes a pair of parallel plate type electrodes 21 and 22 arranged in a vacuum chamber 25, a substrate (object) 23 placed on the electrode 22, a high frequency power source 24 connected with the electrode 24, a gas supply system for supplying a necessary gas and a vacuum exhaust system 27 for exhausting an unnecessary gas and obtaining a necessary low pressure state simultaneously.

In the apparatus of FIG. 2, a raw gas supplied from the gas supply system 26 is decomposed by plasma discharge produced in a space between the electrodes 21 and 22, so that a thin film is formed on a surface of the substrate (object) 23. When the raw gas is, for example, methane, a high frequency energy supplied from the high frequency power source 24 has 13.56 MHz and a reaction pressure is 0.1 Torr, a carbon film can be formed on a surface of the substrate 23. This carbon film is called a hard carbon film or a diamond like carbon (DLC) film in general.

In a parallel plate type electrode structure of FIG. 2, an electric field strength around peripheral (edge) regions of the electrodes is large and discharge produces largely in the regions. That is, since a density of electric line of force becomes large in the peripheral portion, the electric field strength in the region becomes large. As a result, a thickness and a property of a film formed on a surface of the substrate (object) 23 does not become uniform.

SUMMARY OF THE INVENTION

The object of the present invention is to solve the above problem, that is, to obtain a structure capable of producing uniform discharge in a space between a pair of parallel plate type electrodes.

According to the present invention, there is provided a plasma processing apparatus including a pair of electrodes, wherein at least one electrode has an uneven shape, and an interval between the electrodes is 10 mm or less.

Figure 1:
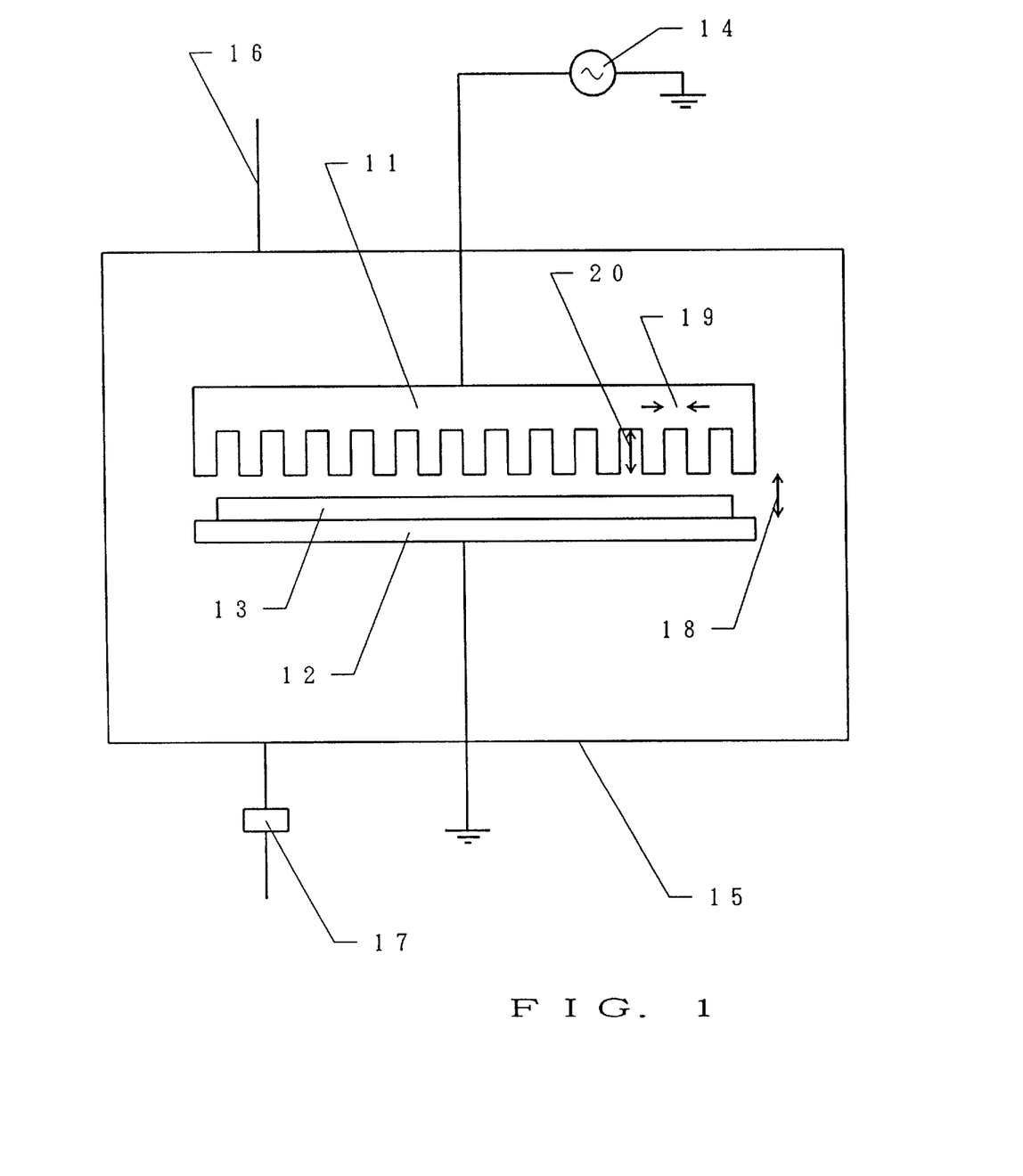
FIG. 1 shows a schematic view of a plasma CVD apparatus according to an embodiment of the present invention.

As the above example, a structure in which at least one of a pair of parallel plate type electrodes, for example, an electrode 11 as shown in FIG. 1, has an uneven shape can be used. In FIG. 1, an uneven shape (concave portion and convex portion) having a desired period is formed on a surface of the electrode 11 connected with the a high frequency power source 14. The surface of the electrode 11 is opposite to an electrode 12.

Figure 5:
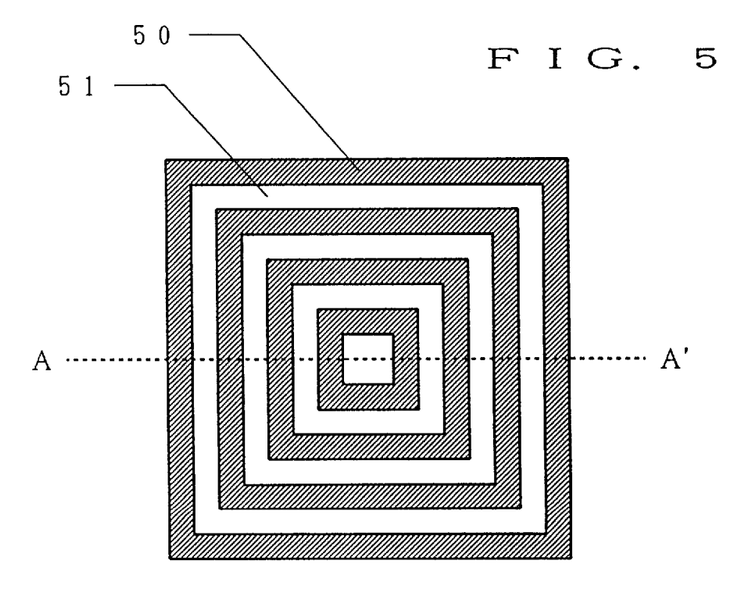
FIG. 5 shows a state of an uneven shape formed in an electrode.

A desired shape such as a circular form and a square form can be used as a shape of an electrode. Also, a cylinder type other than a plate type or the like can be used as an electrode. Further, an uneven shape may be in a concentric circle state from a peripheral portion of an electrode to a center portion of the electrode, or in a state which a lot of convex portions are arranged independently. When an electrode has an square form and an uneven shape is formed in a concentric circle state, the shape as shown in FIG. 5 is obtained. FIG. 5 shows a state which a convex portion 50 and a concave portion 51 are formed periodically.

In FIG. 1, the electrode 11 connected with the high frequency power source 14 has an uneven shape. An uneven shape may be formed in an earthed (grounded) electrode 12. Also, an even shape may be formed in both electrodes. A substrate or an object may be placed in the electrode 11 connected with the high frequency power source 14 without arranging it in the earthed electrode 12.

According to the present invention, there is provided a plasma processing apparatus including a pair of electrodes, wherein at least one electrode has an uneven shape, the uneven shape is denser in a center portion of the electrode than a peripheral portion of the electrode, and an interval between the electrodes is 10 mm or less.

According to the invention's information, it is confirmed that an interval, between a pair of parallel plate type electrodes, having 10 mm or less, is extremely effective to produce strong discharge and increase a processing speed. However, a state that strong discharge produces in peripheral portions of the electrodes is remarkably obtained. Therefore, as described above, an electrode interval is 10 mm or less and at least one electrode has an uneven shape on a surface thereof, so that a state that discharge concentrates a peripheral portion of the electrode can be prevented. In particular, when the uneven shape is dense in a center portion of the electrode, a state that discharge concentrates a peripheral portion of the electrode can be prevented.

According to the present invention, there is provided a plasma processing apparatus including a pair of electrodes for producing plasma, at least one electrode having an uneven shape, wherein an aspect ratio of the uneven shape is increased from a peripheral portion of the electrode to a center portion of the electrode.

Figure 4:
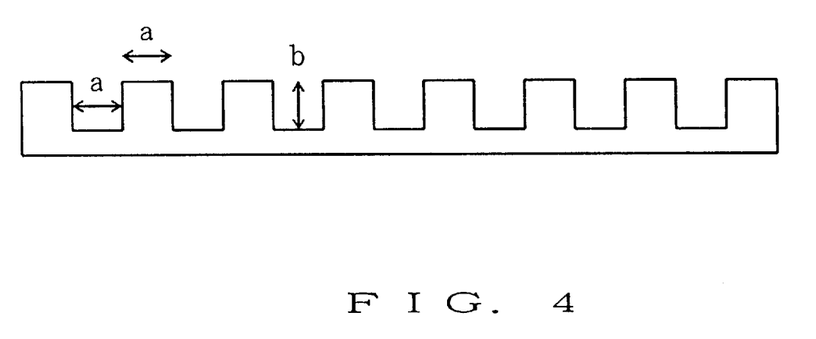
FIG. 4 shows an electrode having an uneven shape.

As shown in FIG. 4, an aspect ratio of an uneven shape is provided by a ratio (b/a) of a height (b) of a convex portion and a width thereof or a pitch (a). By increasing the aspect ratio from a peripheral portion of the electrode to a center portion of the electrode, a density of a convex portion in the center portion of the electrode can be increased. When the aspect ratio is increased from a peripheral portion of the electrode to a center portion of the electrode and a value (a) is constant, since a height of a convex portion is increased to the center portion of the electrode, strong discharge can be produced in the center portion of the electrode. As a result, uniform discharge in a whole electrode can be produced. The aspect ratio may be changed stepwise.

According to the present invention, there is a plasma processing apparatus including a pair of electrodes for producing plasma, at least one electrode having an uneven shape, wherein an aspect ratio of the uneven shape is larger in a center portion of the electrode than a peripheral portion of the electrode.

As described above, by using at least one of a pair of parallel plate type electrodes which has an uneven shape, uniform discharge can be produced. In particular, when an electrode interval is 10 mm or less, strong discharge produced in a peripheral portion of the electrode can be suppressed and uniform discharge in a whole electrode can be produced.

Also, by using at least one of a pair of parallel plate type electrodes which has an uneven shape and a pitch (interval) of an uneven shape is decreased (stepwise) to a center portion of the electrode, further uniform discharge can be produced.

Further, by increasing (stepwise) an aspect ratio (defined by a width and a height of a convex portion of an uneven shape formed on at least one electrode) to a center portion of the electrode, strong discharge produced in a peripheral portion of the electrode can be suppressed and uniform discharge in a whole electrode can be produced.

DETAILED DESCRIPTION OF THE PREFERRED EMBODIMENTS

Embodiment 1

FIG. 1 shows a structure of the embodiment. In FIG. 1, a pair of parallel plate electrodes 11 and 12, an object or a substrate 13 placed in the earthed electrode 12, and a high frequency power source (frequency is 13.56 MHz) 14 connected with the electrode 11 are arranged in a vacuum chamber 15. Further, a gas introducing system 16 for introducing a raw gas, a dilution gas and the like to be used into the vacuum chamber 15 and a gas exhaust system 17 (exhaust pump) for exhausting an unnecessary gas from the vacuum chamber 15 to an external and obtaining a desired reducing pressure (low pressure) state in the vacuum chamber 15 are arranged.

As shown in FIG. 1, the electrode 11 connected with the high frequency power source 14 has a periodic uneven shape on a surface thereof. In an uneven portion, a height 20 is 10 mm, a width 19 is 10 mm. Also, an electrode interval 18 is 10 mm.

When an electrode interval is 10 mm or less, it is preferred that a pressure at discharge is about 1 Torr. Concretely, it is preferred that discharge is produced between 0.5 Torr to 2 Torr.

A methane gas can be used as a raw gas. When the methane gas is used, a carbon coating (film) can be formed.

Embodiment 2

Figure 3:
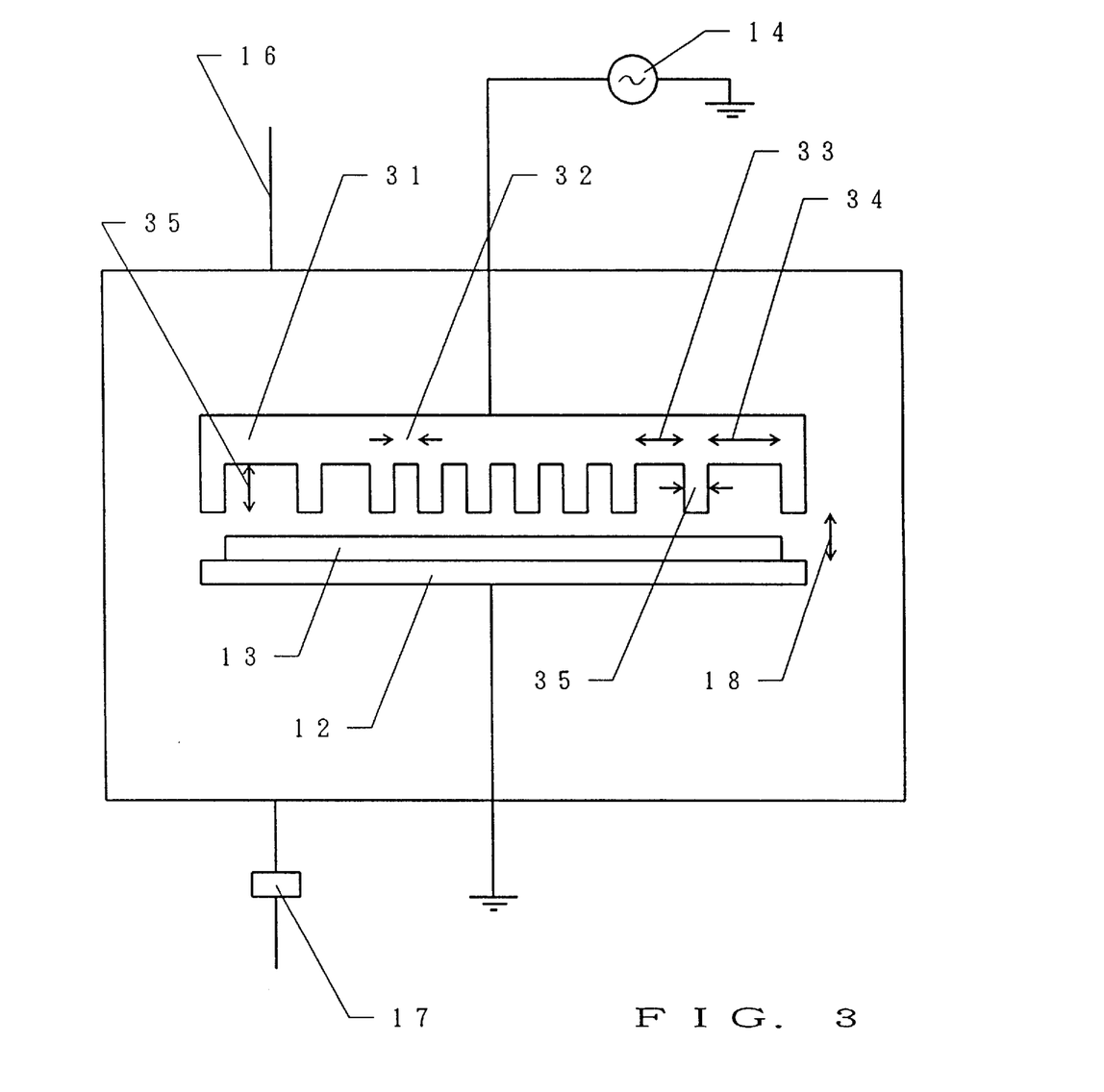
FIG. 3 shows a schematic view of a plasma CVD apparatus according to another embodiment.

FIG. 3 shows the embodiment. In the embodiment, the uneven shape formed on a surface of an electrode 31 connected with the high frequency power source 14 is denser in a center portion than a peripheral portion. The uneven shape has a concentric circle form, as shown in FIG. 5.

By a structure of FIG. 3, uniform discharge in a whole electrode can be produced. That is, when an uneven shape is dense in a center portion of the electrode, discharge in the center portion of the electrode can be produced with the same strength as discharge in a peripheral portion of the electrode. As a result, discharge having uniform strength in a whole electrode can be produced.

In FIG. 3, a height 35 of a convex portion is 10 mm and its pitch is changed with 3 steps. That is, a pitch of the convex portion is changed from a peripheral portion of the electrode. A pitch 34 is 30 mm, a pitch 33 is 20 mm and a pitch 32 is 10 mm.

As described above, in FIG. 3, a pitch of a convex portion is changed with 3 steps and the pitch is constant in a center portion of the electrode. However, a pitch may be decreased from a peripheral portion of the electrode to a center portion of the electrode, so that a density of a convex portion is increased to the center portion of the electrode. Also, a pitch may be changed stepwise.

Embodiment 3

In a structure having an uneven shape on a surface of one of electrodes, as shown in FIG. 3, the embodiment further improves an effect by an convex portion.

In the embodiment, a ratio (b/a) of a width and pitch (a) of a convex portion and a height (b) thereof is defined as an aspect ratio, and the aspect ratio is increased to a center portion of the electrode.

By a structure of the embodiment, a density of a convex portion in a center portion of an electrode can be large, and discharge in a center region can be stronger. Also, since a height of a convex portion in a center portion of an electrode is increased and its effect is improved, discharge in the center portion of the electrode can be strong. As described above, since a state that discharge becomes strong produces in a peripheral portion of a parallel plate type electrode, by producing strong discharge in a center region of the electrode, uniform discharge can be obtained in a whole.

An aspect ratio from a peripheral portion of an electrode to a center portion thereof may be changed stepwise. An uneven shape may be a concentric circle (coaxial) form, or a lot of independent forms.

Embodiment 4

The embodiment relates to, using a film like (tape like) object on which a film is formed, a structure for forming a carbon (coating) film for a surface protection on a surface of the object.

Figure 6:
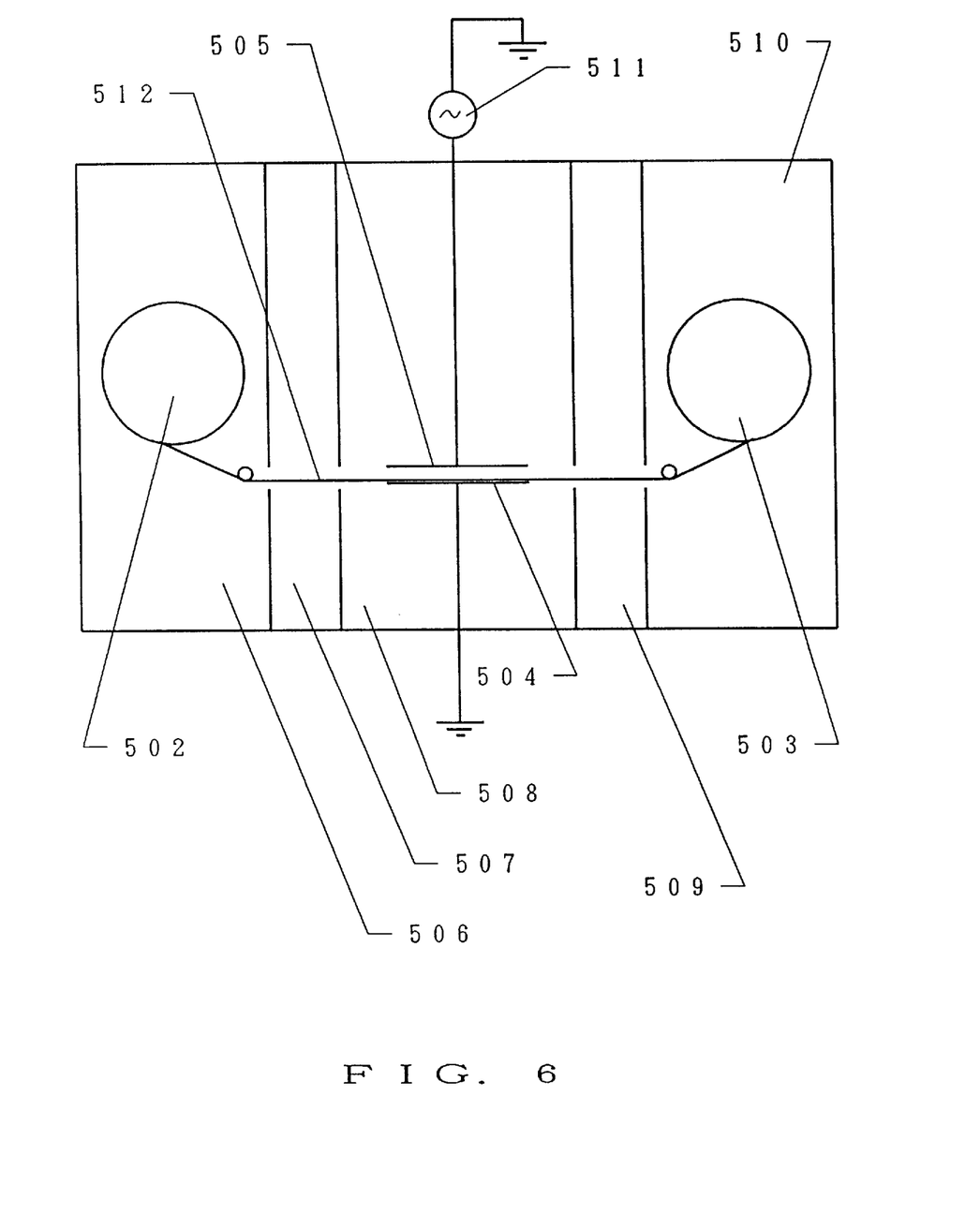
FIG. 6 shows a schematic view of a plasma CVD apparatus according to another embodiment.

FIG. 6 shows a schematic structure of the embodiment, an apparatus for forming a carbon film for a surface protection on a surface of a tape like or film like object (for example, magnetic tape) 51 by high frequency discharge produced between a pair of electrodes 504 and 505. The object 51 is forwarded from a forward roll 503.

The object 512 includes a polyimide film or the like formed on a surface of a magnetic material by a method such as evaporation. The object 512 is wound around the forward roll 503 and is wound up with a winding roll 502. In this state, the object 512 passes through a space between the parallel plate electrodes 504 and 505, so that a carbon film is formed on a surface of the object 512 by plasma vapor phase reaction. The electrode 505 is connected with a high frequency power source 511 and a surface thereof is formed with an uneven shape as shown in Embodiments 1 to 3.

A plasma vapor phase reaction is performed in a reaction chamber 508 under a desired reducing pressure (low pressure). Buffer chambers 507 and 508 are used to reduce a pressure difference between a forward chamber 510 and a winding chamber 506 each having a normal (atmosphere) pressure state and the reaction chamber 508 having a low pressure state.

In film formation, a pressure in the reaction chamber 508 is about 1 Torr, and a hydrocarbon gas such as methane is used as a raw gas. A high frequency power has a high frequency of 13.56 MHz, in general, and is about 1 to 5 W/cm$^2$, to produce a vapor phase reaction.

In a structure of FIG. 6, a carbon film can be formed continuously on a surface of a tape like or film like object. A thickness of a carbon film is, for example, about 200 Å.

Embodiment 5

Figure 7:
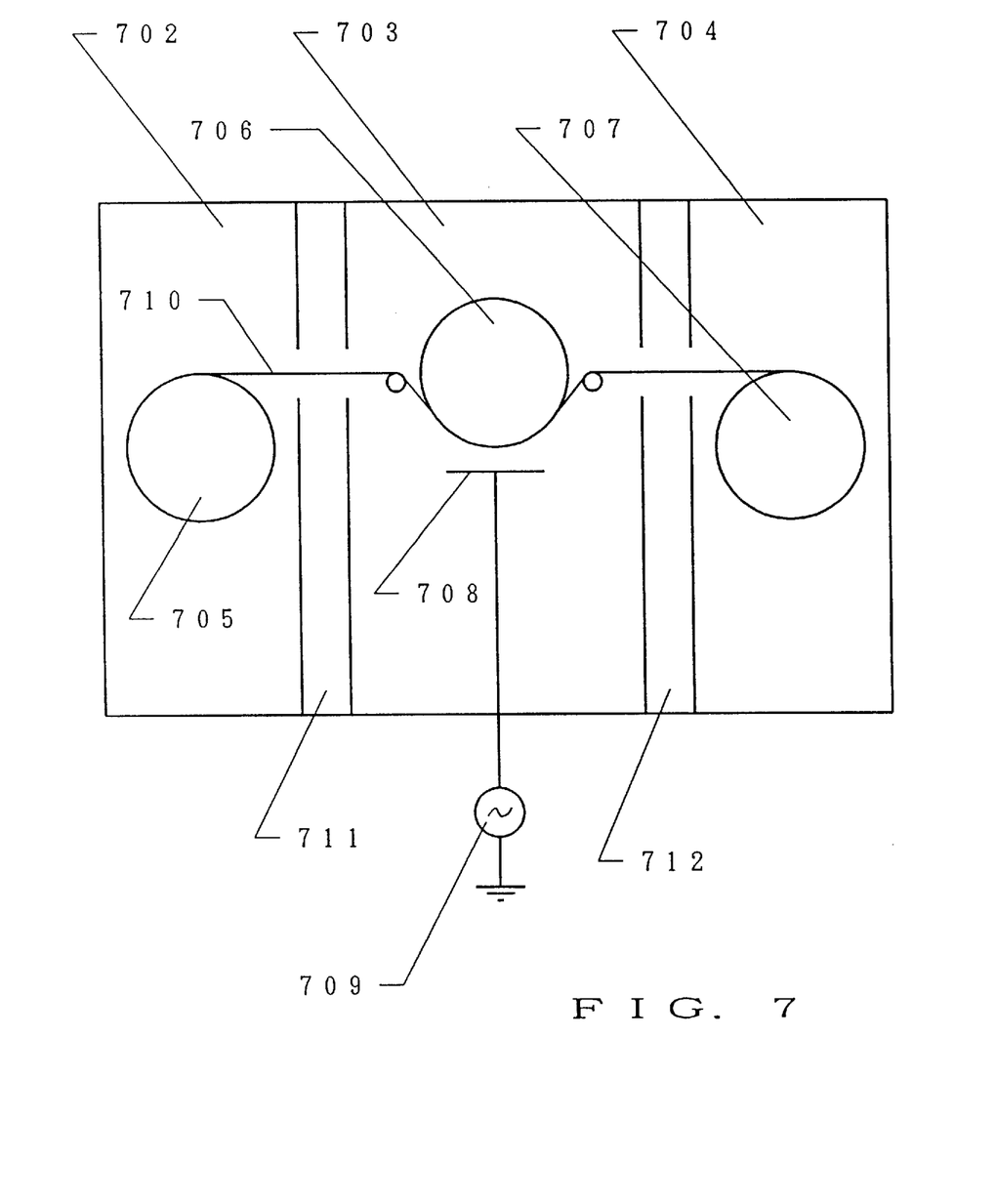
FIG. 7 shows a schematic view of a plasma CVD apparatus according to another embodiment.

FIG. 7 shows a schematic structure of the embodiment, an apparatus for forming a carbon film as a protective film on a surface of a tape like or film like object 710. The object 710 is forwarded from a forward roll 707 and is wound up with a winding roll 705.

The tape like or film like object 710 which is forwarded from the forward roll 707 and is wound up with the winding roll 705 is transferred along a can roll 706 used as an electrode. The can roll 706 has a cylindrical form, and a depth direction in the figure corresponds to a longitudinal direction.

A high frequency discharge is produced between the can roll (electrode) 706 and a plate electrode 708 by a high frequency power supplied from the high frequency power source 709. A carbon film is formed on a surface of an object passed between these electrodes.

Buffer chambers 711 and 712 are arranged between the winding chamber 702 and the reaction chamber 703 and between the reaction chamber 703 and the forward chamber 704, so that a pressure difference between the winding chamber 702 and the forward chamber 704 each having an atmosphere pressure state and the reaction chamber 703 having a low pressure state is reduced. Although not shown in the figure, a gas introducing system and a gas exhaust system are arranged in each chamber. Also, an interval between the electrodes 706 and 708 is 10 mm. This electrode interval is defined as the shortest distance.

A surface of the electrode 708 is formed with an uneven shape as described in Embodiments 1 to 3. By forming an uneven shape in a surface of the electrode 708, uniform discharge in a depth direction of the figure (a width direction of an object to be transferred) can be produced, and uniform film property and uniform film thickness in a width direction of the object can be obtained.

Embodiment 6

The embodiment relates to a structure of the electrode 505 of FIG. 6 and the electrode 708 of FIG. 7. In the embodiment, plate like square electrodes are used as an electrode structure, and an uneven shape which a density is changed in a width direction of a tape like or film like object is formed on a surface of the electrode.

Figure 8A:
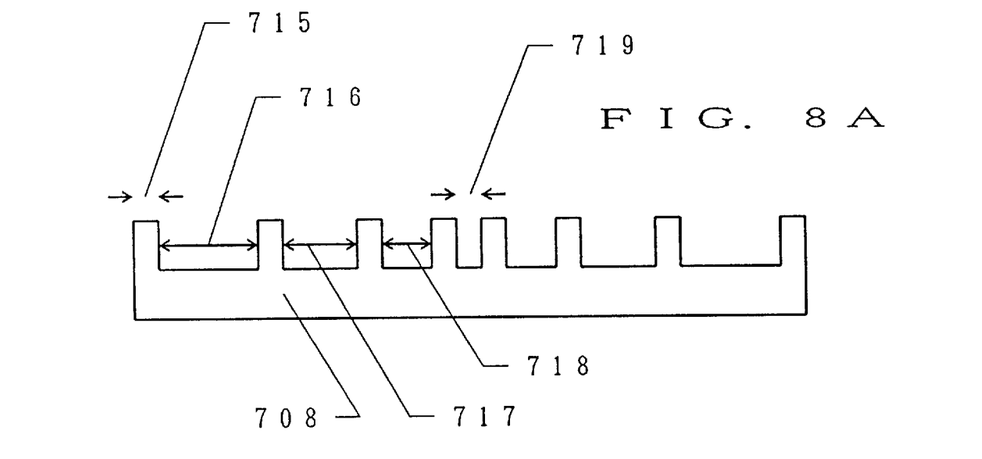
FIGS. 8A and 8B show a structure of an electrode according to another embodiment.
Figure 8B:
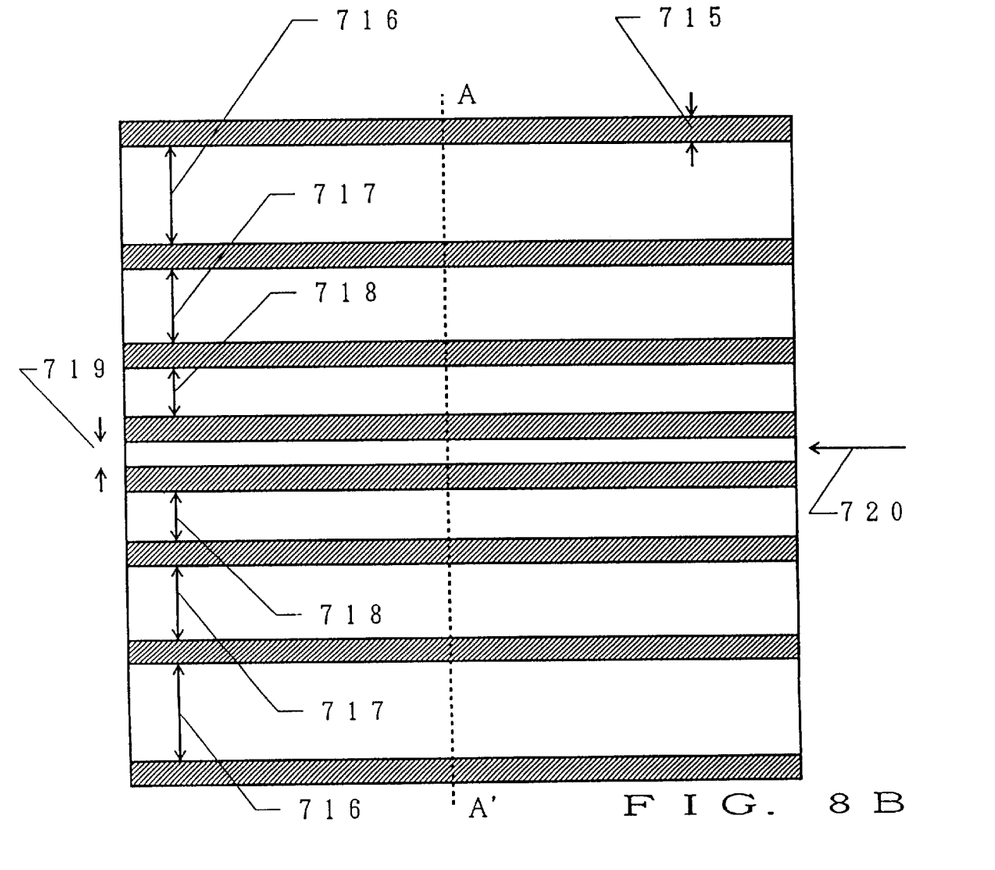

FIGS. 8A and 8B show an electrode structure of the embodiment. FIG. 8A shows a cross section view of an electrode, and FIG. 8B shows an upper view of an electrode. That is, FIG. 8A is a cross section view of FIG. 8B along a line A–A'.

In the embodiment, a width 715 of a convex portion is, for example, 10 mm, and a pitch thereof is changed to a center portion of an electrode. For example, a width 716 is 40 mm, a width 717 is 30 mm, a width 718 is 20 mm and a width 719 is 10 mm. Therefore, a width is decreased stepwise, so that a density of a convex portion is changed.

In the structure of FIGS. 8A and 8B, a tape like or film like object is transferred from a direction shown by an arrow 720. A convex portion of an uneven shape is formed to change a pitch in a width direction of the object.

By the above structure, uniform discharge can be produced in a width direction of an object to be transferred continuously and uniform film property and uniform film thickness can be obtained.

By forming an uneven shape in a surface of at least one of a pair of electrodes, uniform discharge can be produced and uniform plasma processing can be performed. In particular, by increasing (stepwise) a density of an uneven shape to a center portion of an electrode, further uniform discharge can be produced.

A structure which a surface of one of electrodes has an uneven shape is effective in a case wherein an electrode interval is 10 mm or less. That is, when an electrode interval is 10 mm or less, strong discharge produced in a peripheral portion of an electrode can be suppressed, and uniform discharge can be obtained.

What is claimed is:

1. A plasma processing apparatus comprising:
   a pair of electrodes for producing plasma, at least one electrode having a plurality of protrusion portions and groove portions, an interval between the electrodes being 10 mm or less;
   a substrate disposed on one of said pair of electrodes,
   wherein the plurality of protrusion portions and groove portions are denser in a center portion of the electrode than a peripheral portion of the electrode and,
   wherein at least one of the pair of electrodes on which said substrate is placed is grounded.

2. A plasma processing apparatus comprising:
   a pair of electrodes for producing plasma, at least one electrode having a plurality of convex portions and concave portions;
   a substrate disposed on one of said pair of electrodes,
   wherein an aspect ratio of the plurality of convex portions is increased from a peripheral portion of the electrode to a center portion of the electrode and,
   wherein at least one of the pair of electrodes on which said substrate is placed is grounded.

3. The apparatus of claim 2 wherein the aspect ratio represents a ratio (b/a) of a pitch (a) and a height (b).

4. The apparatus of claim 2 wherein an interval between the electrodes is 10 mm or less.

5. A plasma processing apparatus comprising:
   a pair of electrodes for producing plasma, at least one electrode having a plurality of protrusion portions and groove portions;
   a substrate disposed on one of said pair of electrodes,
   wherein an aspect ratio of the plurality of protrusion portions is larger in a center portion of the electrode than a peripheral portion of the electrode and,
   wherein at least one of the pair of electrodes on which said substrate is placed is grounded.

6. The apparatus of claim 5 wherein the aspect ratio represents a ratio (b/a) of a pitch (a) and a height (b).

7. The apparatus of claim 5 wherein an interval between the electrodes is 10 mm or less.

8. A film formation method comprising the steps of:

placing an object on one of a pair of electrodes, wherein the other of said pair of electrodes has a plurality of convex portions and concave portions, an interval between said pair of electrodes is 10 mm or less, and the plurality of convex portions and concave portions are denser in a center portion of the electrode than a peripheral portion of the electrode;

introducing a film forming gas into a space between the pair of electrodes;

applying an electromagnetic energy to the electrodes, to produce plasma in the space; and forming a film on said object, wherein said one of electrodes on which said object is placed is grounded.

9. The method of claim 8 wherein the film comprises a diamond like carbon film.

10. The method of claim 8 wherein the object comprises a magnetic tape.

11. The apparatus of claim 8 wherein the plasma processing apparatus comprises an etching apparatus.

12. A film formation method comprising the steps of:

placing an object on one of a pair of electrodes; wherein the other of said pair of electrodes has a plurality or protrusion portions and groove portions, an interval between the electrodes is 10 mm or less, and an aspect ratio of the plurality or protrusion portions is increased from a peripheral portion of the electrode to a center portion of the electrode;

introducing a gas into a space between the pair of electrodes;

applying an electromagnetic energy to the electrodes, to produce plasma in the space; and forming a film on said object, wherein said one of electrodes on which said object is placed is grounded.

13. The method of claim 12 wherein the film comprises a diamond like carbon film.

14. The method of claim 12 wherein the object comprises a magnetic tape.

15. The apparatus of claim 12 wherein the plasma processing apparatus comprises an etching apparatus.

16. A method of manufacturing a protective film comprising carbon comprising the steps of:

disposing a substrate on one of a pair of electrodes in a reaction chamber, said substrate having a magnetic layer provided thereon and one of the pair of electrodes having a plurality of convex portions and concave portions;

introducing a reactive gas into said reaction chamber;

applying an alternating voltage to another one of the electrodes while said one of the electrodes is grounded in order to produce a plasma of said reactive gas; and depositing a film comprising carbon over said magnetic layer through plasma CVD.

17. A method according to claim 16 wherein said substrate is in the form of a tape.

18. A method according to claim 16 wherein said alternating voltage has a frequency 13.56 MHz.

19. A plasma processing apparatus comprising:

a first electrode being grounded;

a second electrode opposed to said first electrode, wherein said second electrode is connected with a high frequency power source and has a plurality of convex portions on a side of said second electrode facing the first electrode, wherein said first electrode functions to support a substrate thereon, and wherein a density of said convex portions decreases from a central portion of said second electrode toward an outer portion thereof and, said density is constant in said central portion.

20. The apparatus according to claim 19 wherein side surfaces between adjacent convex portions in said second electrode have at least three different intervals of 10 mm, 20 mm and 30 mm respectively.

21. The apparatus according to claim 19 wherein an interval between said first electrode and said second electrode is 10 mm or less.

22. The apparatus according to claim 19 wherein said apparatus is a plasma CVD apparatus for depositing a carbon film on said substrate.

23. The apparatus according to claim 22 wherein said carbon film comprises diamond like carbon.

24. The apparatus according to claim 19 wherein said convex portions are arranged in a coaxial manner on said second electrode.

25. A plasma processing apparatus comprising:

a first electrode;

a second electrode opposed to said first electrode, said second electrode having a plurality of convex portions on a side thereof facing said first electrode;

gas introducing means for introducing a reactive gas to a space between said first and second electrode;

means for disposing a substrate on said first electrode;

a power source for applying a voltage between said first and second electrodes in order to form a film on said substrate through plasma CVD; and moving means for moving said substrate in one direction during said plasma CVD, wherein a density of said convex portions decreases from a central portion of said second electrode toward an outer portion thereof in a direction orthogonal to said direction in which said substrate is moved.

26. The apparatus according to claim 25 wherein side surfaces between adjacent convex portions in said second electrode have at least four different intervals of 10 mm, 20 mm, 30 mm and 40 mm respectively.

27. The apparatus according to claim 25 wherein an interval between said first electrode and second electrode which are arranged in parallel is 10 mm or less.

28. The apparatus according to claim 25 wherein said film comprises carbon.

29. The apparatus according to claim 25 wherein said film comprises diamond like carbon.

30. The apparatus according to claim 25 wherein said convex portions extend in parallel to the direction in which said substrate is moved.

31. The apparatus according to claim 25 wherein said substrate is a tape.

32. The apparatus according to claim 25 wherein said first electrode has a cylindrical shape.

\* \* \* \* \*

UNITED STATES PATENT AND TRADEMARK OFFICE
CERTIFICATE OF CORRECTION

PATENT NO.       : 5,820,947
APPLICATION NO.  : 08/820985
DATED            : October 13, 1998
INVENTOR(S)      : Kenji Itoh It is certified that error appears in the above-identified patent and that said Letters Patent is hereby corrected as shown below:

On the front page of the patent, the Assignee's name "Semicondutor Energy Laboratory Co., Ltd." should be deleted, and replaced with --Semiconductor Energy Laboratory Co., Ltd.--.

Signed and Sealed this

Twelfth Day of May, 2009

JOHN DOLL
*Acting Director of the United States Patent and Trademark Office*